(12) United States Patent
Hong

(10) Patent No.: US 10,756,157 B2
(45) Date of Patent: Aug. 25, 2020

(54) ELECTROLUMINESCENT DISPLAY DEVICE HAVING LOW POTENTIAL POWER PAD CONTACT

(71) Applicant: LG DISPLAY CO., LTD., Seoul (KR)

(72) Inventor: SangPyo Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/226,516

(22) Filed: Dec. 19, 2018

(65) Prior Publication Data

US 2019/0206327 A1 Jul. 4, 2019

(30) Foreign Application Priority Data

Dec. 29, 2017 (KR) .................. 10-2017-0184775

(51) Int. Cl.
*G09G 3/3258* (2016.01)
*H01L 27/32* (2006.01)
*G09G 3/3225* (2016.01)

(52) U.S. Cl.
CPC ....... *H01L 27/3276* (2013.01); *G09G 3/3258* (2013.01); *H01L 27/32* (2013.01); *G09G 3/3225* (2013.01); *G09G 2300/0426* (2013.01); *G09G 2330/04* (2013.01)

(58) Field of Classification Search
CPC ............... H01L 27/3276; H01L 27/124; H01L 27/14634; H01L 27/14636; H01L 27/3297; H01L 27/32; G09G 2300/0426; G09G 2330/00; G09G 2330/04; G09G 3/3258; G09G 3/3225
See application file for complete search history.

(56) References Cited

U.S. PATENT DOCUMENTS

| | | | |
|---|---|---|---|
| 2011/0157114 A1 | 6/2011 | Ko et al. | |
| 2014/0111116 A1* | 4/2014 | Shin | H01L 27/3279 315/312 |
| 2014/0111404 A1* | 4/2014 | Omata | H05B 33/08 345/76 |
| 2014/0139413 A1* | 5/2014 | Kwon | G09G 3/3291 345/82 |
| 2016/0320671 A1* | 11/2016 | Lv | G02F 1/134363 |
| 2018/0204895 A1* | 7/2018 | Lin | G09G 3/3233 |

* cited by examiner

*Primary Examiner* — Darlene M Ritchie
(74) *Attorney, Agent, or Firm* — Polsinelli PC

(57) ABSTRACT

Disclosed is an electroluminescent display device which is capable of preventing a current density from being concentrated when low-potential power is supplied from a low-potential power supply pad, wherein the electroluminescent display device includes a display panel including a plurality of pixels, a pad portion provided in the edge of the display panel, and configured to include a low-potential power pad supplied with low-potential power, and a low-potential contact portion for electrically connecting the low-potential power pad with the plurality of pixels, wherein the low-potential contact portion has a round shape.

17 Claims, 2 Drawing Sheets

ELECTROLUMINESCENT DISPLAY DEVICE HAVING LOW POTENTIAL POWER PAD CONTACT

CROSS-REFERENCE TO RELATED APPLICATION

This application claims the benefit of the Korean Patent Application No. 10-2017-0184775 filed on Dec. 29, 2017, which is hereby incorporated by reference in its entirety as if fully set forth herein.

BACKGROUND

Field of the Disclosure

The present disclosure relates to a display device, and more particularly, to an electroluminescent display device. Although the present disclosure is suitable for a wide scope of applications, it is particularly suitable for preventing a current density from being concentrated at the contact area when a low-potential power is supplied from a low-potential power supply pad.

Description of the Background

An electroluminescent display device is provided in such a way that an emission layer is formed between two electrodes. According as the emission layer emits light by an electric field generated between the two electrodes, an image is displayed on the electroluminescent display device.

The emission layer may be formed of an organic material which emits light when an exciton is generated by the combination of an electron and a hole, and the exciton falls to the ground state from the excited state. Alternatively, the emission layer may be formed of an inorganic material such as a quantum dot.

In the conventional electroluminescent display device, when a low-potential power is supplied from a low-potential power supply pad, a current density is concentrated at the contact area, whereby heat is generated. As a result, a polarizing film can be melt and its color can be changed due to the generated heat.

SUMMARY

The present disclosure has been made in view of the above problems, and it is an object of the present disclosure to provide an electroluminescent display device which is capable of preventing a current density from being concentrated when a low-potential power is supplied from a low-potential power supply pad.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

In accordance with an aspect of the present disclosure, the above and other objects can be accomplished by the provision of an electroluminescent display device comprising a display panel including a plurality of pixels, a pad portion provided in the edge of the display panel, and configured to include a low-potential power pad supplied with low-potential power, and a low-potential contact portion for electrically connecting the low-potential power pad with the plurality of pixels, wherein the low-potential contact portion has a round corner shape.

In another aspect of the present disclosure, an electroluminescent display device includes a display panel including a plurality of data lines and a plurality of gate lines; a pad portion disposed at an edge of the display panel and including a low potential power pad receiving a low potential power and a data pad connected with the plurality of data line; and a low potential contact portion electrically connected with the low potential power pad and having a round corner shape at located at both end portions of lateral surfaces of an area adjacent to the low-potential power pad.

In a further aspect of the present disclosure, an electroluminescent display device includes a display panel where an active area and an non-active area are defined at a substrate and including a plurality of data lines, a plurality of gate lines and a plurality of pixels; a low potential power pad receiving a low-potential power through a low-potential power supply line; a data pad connected with the plurality of data line; a link electrode layer electrically connected with the low-potential power supply line to receive the low-potential power; a dummy electrode layer disposed on the link electrode layer; a low-potential electrode layer disposed on the dummy electrode layer; and a low potential contact portion electrically connected with the low potential power pad and having a round corner shape at located at both end portions of lateral surfaces of an area adjacent to the low-potential power pad.

It is to be understood that both the foregoing general description and the following detailed description are exemplary and explanatory and are intended to provide further explanation of the disclosure as claimed.

BRIEF DESCRIPTION OF THE DRAWINGS

The above features and other advantages of the present disclosure will be more clearly understood from the following detailed description taken in conjunction with the accompanying drawings, in which.

DETAILED DESCRIPTION

Figure 1:
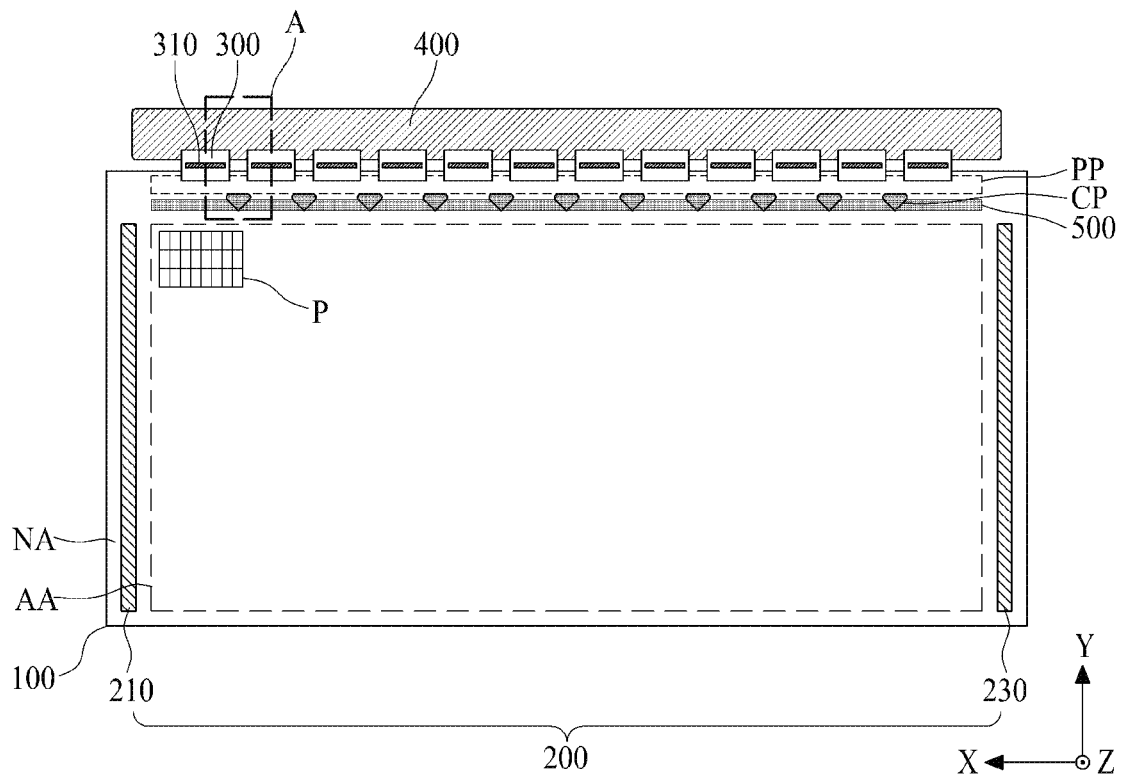
FIG. 1 is a plane view illustrating an electroluminescent display device according to an aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, an electroluminescent display device according to the aspect of the present disclosure will be described in detail with reference to the accompanying drawings.

Figure 2:
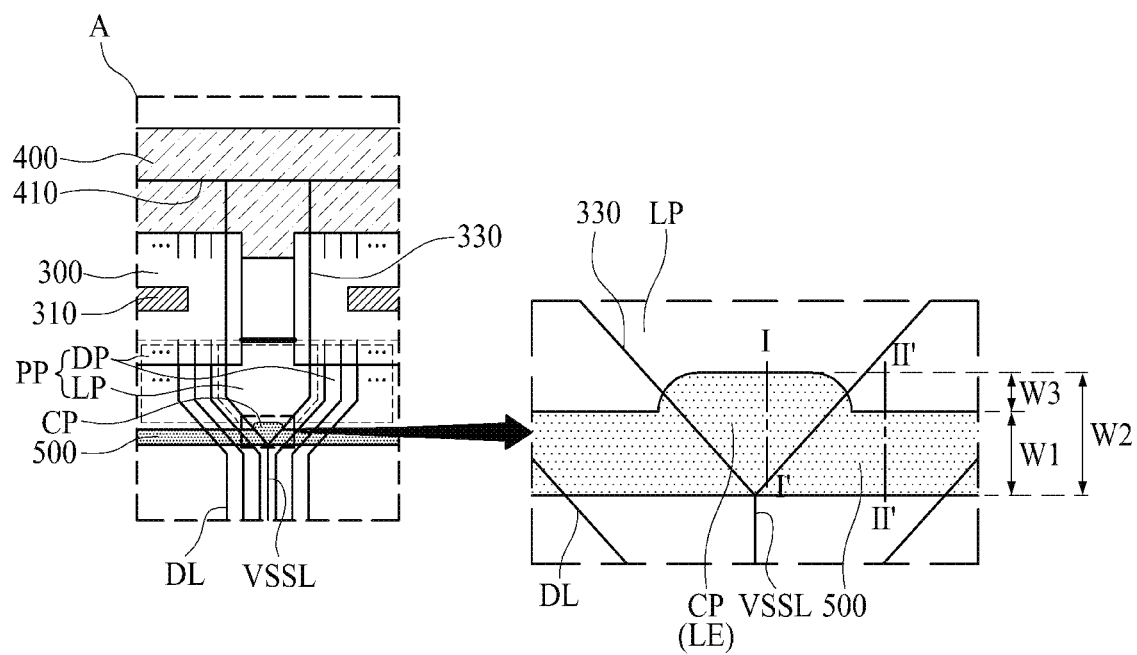
FIG. 2 is an enlarged plane view showing 'A' of FIG. 1.

FIG. 1 is a plane view illustrating an electroluminescent display device according to an aspect of the present disclosure. FIG. 2 is an enlarged plane view showing 'A' of FIG. 1.

Referring to FIGS. 1 and 2, the electroluminescent display device according to one aspect of the present disclosure may include a display panel 100, a gate driver 200, a flexible circuit film 300, a printed circuit board 400, a low-potential electrode layer 500, a pad portion PP, and a low-potential contact portion CP.

The display panel 100 may include an active area AA having a plurality of pixels P prepared on a substrate, and a non-active area NA surrounding the active area AA.

The plurality of pixels P may be formed in a plurality of pixel regions defined by a plurality of gate lines (not shown) and a plurality of data lines DL, wherein the pluralities of gate and data lines are perpendicular to each other.

The plurality of gate lines is arranged in a first direction (i.e., along the X-axis), for example, in a horizontal direction of the display panel 100. The gate lines are parallel to each other.

The plurality of data lines DL is arranged in a second direction (i.e., along the Y-axis), for example, in a vertical direction, of the display panel 100. The data lines DL are parallel to each other, wherein the plurality of data lines DL is perpendicular to the plurality of gate lines. Herein, a data voltage is individually supplied from a data driving integrated circuit 310 to the plurality of data lines DL. In this case, the data voltage supplied to each of the plurality of data lines DL may include a compensation voltage for compensating a characteristic change value such as threshold voltage and mobility of a driving transistor included in the corresponding pixel P.

Each of the plurality of pixels P according to one aspect of the present disclosure may include an emission device and a pixel circuit.

The emission device emits light which is proportional to a data current flowing in accordance with a driving of the pixel circuit. The emission device is interposed between an anode electrode and a cathode electrode connected with the pixel circuit, wherein the emission device may include at least one among an organic emitting portion, a quantum dot emitting portion, and an inorganic emitting portion, or may include a micro emitting diode device.

The emission device according to one aspect of the present disclosure includes two or more emitting portions for emitting white light. For example, the emission device may include first and second emitting portions so as to emit white light obtained by mixing first light with second light. The first emitting portion emits the first light, which may include any one among a blue emitting portion, a green emitting portion, a red emitting portion, a yellow emitting portion, and a yellowish green emitting portion. The second emitting portion may include an emitting portion for emitting light whose color is complementary to the first color among a blue emitting portion, a green emitting portion, a red emitting portion, a yellow emitting portion, and a yellowish green emitting portion.

The emission device according to another aspect of the present disclosure may include a blue emitting portion, a green emitting portion, or a red emitting portion.

The pixel circuit may include a plurality of driving transistors, switching transistors, and capacitor. In response to a gate signal supplied to the gate line, the pixel circuit may supply the data current corresponding to a data signal to the emission device.

The gate driver 200 may be provided in the non-active area NA at one side and/or both sides of the display panel 100, and may be connected with the gate line. In this case, the gate driver 200 may be directly formed on the substrate of the display panel 100 for a process of forming a thin film transistor of each pixel P, and may be connected with one side or both sides in each gate line.

The gate driver 200 according to one aspect of the present disclosure may include a first gate driving internal circuit 210 and a second gate driving internal circuit 230.

The first gate driving internal circuit 210 is disposed in the non-active area NA on the left side of the display panel 100, and is electrically connected with one end in each of the odd-numbered gate lines among the plurality of gate lines.

The second gate driving internal circuit 230 is disposed in the non-active area NA on the right side of the display panel 100, and is electrically connected with the other end in each of the even-numbered gate lines among the plurality of gate lines.

The flexible circuit film 300 may be formed of a tape carrier package (or TCP) or a chip on flexible board or chip on film (or COF), and is attached to a pad portion PP formed in the upper portion of the non-active area NA of the display panel 100 by a tape automated bonding (or TAB) process.

The data driving integrated circuit 310 is mounted on the flexible circuit film 300. The data driving integrated circuit 310 converts digital input data into the data signal of an analog type by the use of digital input data, data control signal, and reference gamma voltages supplied through the flexible circuit film 300, and supplies the generated data signal to the data line DL through the flexible circuit film 300 and the pad portion PP.

The printed circuit board 400 may be attached to the flexible circuit film 300 by a film attachment process using a conductive anisotropic film. The printed circuit board 400 transmits externally-provided signal to the flexible circuit film 300.

The printed circuit board 400 according to one aspect of the present disclosure is electrically connected with the flexible circuit film 300 attached to the pad portion PP provided in the upper portion of the non-active area NA of the display panel 100. To this end, a low-potential power input line 410, which is connected with a low-potential power supply line 330, is formed in the printed circuit board 400.

The low-potential electrode layer 500 is formed in the upper portion of the non-active area NA of the display panel 100. For example, the low-potential electrode layer 500 is positioned adjacent to the area for the pad portion PP in the upper portion of the non-active area NA of the display panel 100. That is, the low-potential electrode layer 500 may extend along the first direction X of the display panel 100 between the active area AA and the pad portion PP to which the flexible circuit film 300 is attached.

The low-potential electrode layer 500 according to one aspect of the present disclosure may be provided at the same layer as the anode electrode formed in the pixel P, and may be formed of the same material as the anode electrode formed in the pixel P. The low-potential electrode layer 500 may be formed by the process of forming the anode electrode, and the low-potential electrode layer 500 may be formed of a reflective metal material.

The low-potential electrode layer 500 according to one aspect of the present disclosure may be formed to have a width in the second direction Y. Herein, the width of the low-potential electrode layer 500 may be not constant. For example, the low-potential electrode layer 500 may have a relatively large width in the low-potential contact portion CP. This will be described in detail later.

The pad portion PP is formed in the upper portion of the non-active area NA of the display panel 100. The pad portion PP receives signals from the flexible circuit film 300, and transmits the signals to the plurality of pixels P. The pad portion PP may include a data pad DP connected with the plurality of data lines DL, and a low-potential power pad LP.

The data pads DP are provided at fixed intervals, and are connected with the data line DL.

The low-potential power pad LP is formed between each of the plurality of data pads DP, and is electrically connected with the low-potential contact portion CP. The low-potential power pad LP is formed adjacent to the low-potential contact portion CP, whereby low-potential power may be supplied to the low-potential contact portion CP. In this case, the low-potential contact portion CP may be provided in such a way that its end portions of both lateral surfaces of the area adjacent to the low-potential power pad LP may have a round corner shape. This will be described in detail later.

The low-potential power pad LP according to one aspect of the present disclosure may include the low-potential power supply line 330 for supplying low-potential power to the low-potential contact portion CP.

The low-potential power supply line 330 is formed inside the low-potential power pad LP, and the low-potential power supply line 330 extends to be connected with the low-potential power input line 410 of the printed circuit board 400. The low-potential power supply line 330 receives the low-potential power from the low-potential power input line 410, and supplies the low-potential power to the low-potential contact portion CP.

The low-potential power supply line 330 according to one aspect of the present disclosure is in contact with the end portions of both lateral surfaces of the low-potential contact portion CP, to thereby supply the low-potential power. In this case, the end portions of both lateral surfaces of the low-potential contact portion CP may have a round corner shape. For example, the low-potential contact portion CP may be formed in an inverted triangle with rounded vertices. The low-potential contact portion CP is formed to have the round corner shape in the area being in contact with the low-potential power supply line 330, whereby it is possible to lower the current density in the low-potential contact portion CP, and thus, to reduce heat generated in the low-potential contact portion CP and the pad portion PP by the lowering of the current density.

The low-potential contact portion CP according to one aspect of the present disclosure has a round corner shape in the area being in contact with the low-potential power supply line 330, to thereby lower the current density in the low-potential contact portion CP. For example, in case of the related art, the low-potential contact portion CP is formed in the inverted triangle structure, and the low-potential power is supplied to the vertices in the end portions of both lateral surfaces thereof, whereby the current density can be increased, and heat can be generated therein. However, in the electroluminescent display device according to one aspect of the present disclosure, the area to be supplied with the low-potential power is rounded so that the low-potential power can be evenly distributed and uniformly supplied to the low-potential contact portion CP without being concentrated on a localized point. Thus, in case of the electroluminescent display device according to one aspect of the present disclosure, it is possible to lower the current density, and to reduce heat generated in the low-potential contact portion CP and the pad portion PP. Accordingly, a polarizing film from being melted by the heat generated in the low-potential contact portion CP and the pad portion PP can be prevented, and thereby preventing color changes in the polarizing film.

The low-potential contact portion CP is formed in the upper portion of the non-active area NA of the display panel 100, and is electrically connected with the low-potential power pad LP.

As described above, the low-potential contact portion CP is formed between the low-potential power pad LP and the pixel P so that the low-potential contact portion CP may receive the low-potential power from the low-potential power pad LP. The low-potential contact portion CP may receive the low-potential power from the low-potential power pad LP, and may supply the low-potential power to the plurality of pixels through a low-potential power line VSSL. A detailed structure of the low-potential contact portion CP will be described later.

Figure 3:
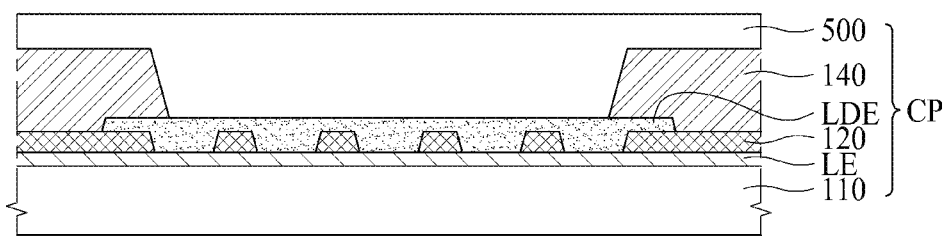
FIG. 3 is a cross-sectional view taken along line I-I' of FIG. 2.

FIG. 3 is a cross-sectional view taken along line I-I' of FIG. 2. FIG. 3 illustrates a cross section of a low-potential contact portion shown in FIG. 2.

Referring to FIG. 3, the low-potential contact portion CP may include a substrate 110, a link electrode layer LE, a dummy electrode layer LDE, and a low-potential electrode layer 500.

The substrate 110 may include a transparent polyimide material. The substrate 110 of the polyimide material may be obtained by curing polyimide resin coated at a constant thickness onto a front surface of a release layer prepared in a carrier glass substrate. On one surface of the substrate 110, there are the aforementioned gate line, the data line, and the plurality of pixels.

The link electrode layer LE is formed on the substrate 110. The link electrode layer LE is connected with a lower-potential power pad LP via a low-potential power supply line 330, as shown in FIG. 2 and FIG. 3. That is, the link electrode layer LE firstly receives the low-potential power from the low-potential power pad LP.

The link electrode layer LE according to one aspect of the present disclosure is formed for a process of forming a gate electrode included in the plurality of pixels P. The link electrode layer LE may be provided in the same layer as the gate electrode, and may be formed of the same material as that of the gate electrode. The link electrode layer LE may be formed of a material having low resistivity so as to reduce the rising of low-potential power. For example, the link electrode layer LE may include a first metal layer of Cu material on the substrate 110, and a second metal layer of MoTi material on the first metal layer.

The link electrode layer LE according to one aspect of the present disclosure may be connected with the dummy electrode layer LDE via a plurality of contact holes formed in an insulating film 120 for covering the link electrode layer LE.

The dummy electrode layer LDE is formed in an island shape on the insulating film 120 while being overlapped with the link electrode layer LE, whereby the dummy electrode layer LDE is electrically connected with the link electrode layer LE via a plurality of contact holes formed in the insulating film 120. The dummy electrode layer LDE is formed for a process of forming source/drain electrodes included in the plurality of pixels P. The dummy electrode layer LDE is provided in the same layer as the source/drain electrodes, and is formed of the same material as that of the source/drain electrodes. The dummy electrode layer LDE is formed of the same material as that of the aforementioned link electrode layer LE, and is provided in the same structure as that of the link electrode layer LE. For example, the dummy electrode layer LDE may include a first metal layer of Cu material, and a second metal layer of MoTi material on the first metal layer.

The low-potential electrode layer 500 is electrically connected with the dummy electrode layer LDE via a contact hole formed in a passivation layer 140 for covering the dummy electrode layer LDE. In this case, the passivation layer 140 is formed on a thin film transistor, to thereby protect the thin film transistor included in the plurality of pixels P. The passivation layer 140 may extend to the non-active area NA.

The low-potential electrode layer 500 is electrically connected with the link electrode layer LE via the dummy electrode layer LDE. According as the low-potential electrode layer 500 is electrically connected with the low-potential power pad LP via the dummy electrode layer LDE and the link electrode layer LE, the low-potential electrode layer 500 may receive the low-potential power from a flexible circuit film 300.

Although not shown, the low-potential electrode layer 500 according to one aspect of the present disclosure may be electrically connected with the low-potential power line VSSL via a contact hole. The low-potential power line VSSL is formed for a process of forming the source/drain electrodes included in the plurality of pixels P. The low-potential power line VSSL may be formed of the same material as that of the source/drain electrodes.

The low-potential power line VSSL extends in the second direction Y of the display panel 100, and the low-potential power line VSSL is parallel to the data line DL, whereby the low-potential power may be supplied to the plurality of pixels P. Herein, the low-potential power line VSSL corresponds to an auxiliary line for the low-potential power. In case of a direct connection with a cathode electrode, it may have a problem related with high resistance. In order to overcome this problem related with high resistance, the low-potential power line VSSL, which extends in the second direction Y, is individually connected with the cathode electrode in each of the plurality of pixels, and is supplied with the low-potential power. Thus, the cathode electrode is connected with the low-potential power line VSSL in parallel, a resistance may be lowered on the cathode electrode so that it is possible to improve luminance uniformity by preventing non-uniformity of luminance in the plurality of pixels.

Figure 4:
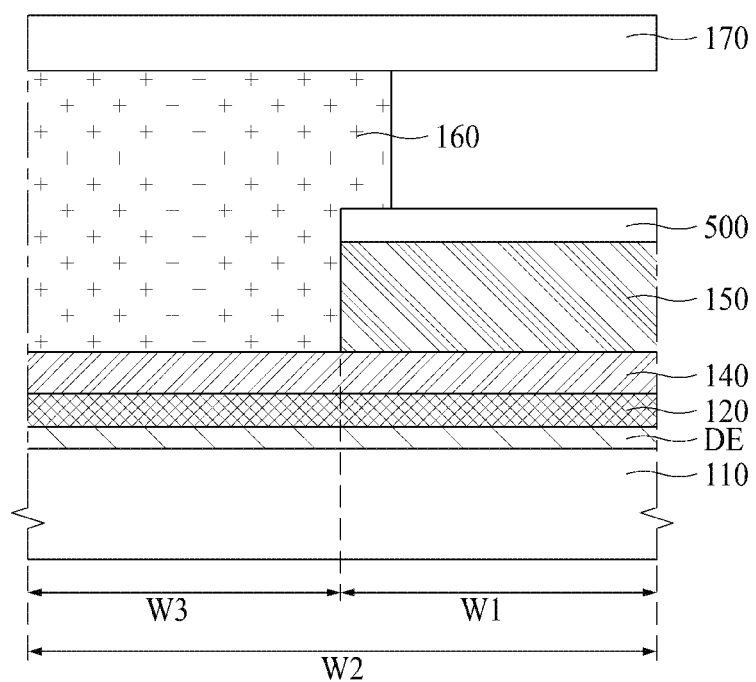
FIG. 4 is a cross-sectional view taken along line II-II' of FIG. 2.

FIG. 4 is a cross-sectional view taken along line II-II' of FIG. 2. FIG. 4 illustrates a cross-section of the area which is close to the low-potential contact portion shown in FIG. 2. Herein, the area which is close to the low-potential contact portion is referred to as a data line connection portion.

Referring to FIG. 4, the data line connection portion includes a substrate 110, a data electrode layer DE, a planarization layer 150, a low-potential electrode layer 500, a dam structure 160, and an encapsulation substrate 170. The substrate 110 of FIG. 4 is identical to the substrate of FIG. 3, whereby a detailed description for the substrate 110 may be omitted.

The data electrode layer DE is formed on the substrate 110. The data electrode layer DE is connected with a data pad DP. That is, the data electrode layer DE receives a data signal from the data pad DP, and supplies the data signal to the plurality of pixels. Herein, it may safely be said that the data electrode layer DE is identical to the data line shown in FIG. 2.

The data electrode layer DE according to one aspect of the present disclosure is formed for a process of forming a gate electrode included in the plurality of pixels P. The data electrode layer DE is provided in the same layer as the gate electrode, and is formed of the same material as that of the gate electrode. The data electrode layer DE may be formed of a material having low resistivity so as to reduce the rising of low-potential power. For example, the data electrode layer DE may include a first metal layer of Cu material on the substrate 110, and a second metal layer of MoTi material on the first metal layer.

An insulating film 120 and a passivation layer 140 are formed on the data electrode layer DE. A detailed description for the insulating film 120 and the passivation layer 140 will be omitted.

The planarization layer 150 is formed on the passivation layer 140. The planarization layer 150 is provided to realize a flat upper surface of the substrate 100 provided with a thin film transistor, wherein the planarization layer 150 extends to a non-active area NA. The planarization layer 150 may be formed of an organic insulating material, for example, acryl resin, epoxy resin, phenolic resin, polyamide resin, polyimide resin, and etc., but not limited to these materials.

The low-potential electrode layer 500 is formed on the planarization layer 150. A width of the low-potential electrode layer 500 in the data line connection portion may be referred to as a first width W1, and a width of the low-potential electrode layer 500 in the low-potential contact portion CP shown in FIG. 3 may be referred to as a second width W2. That is, the width of the low-potential electrode layer 500 in the low-potential contact portion CP may be different from the width of the low-potential electrode layer 500 in the data line connection portion adjacent to the low-potential contact portion CP. In detail, the second width W2 of the low-potential contact portion CP may be larger than the first width W1 of the data line connection portion.

Accordingly, the low-potential electrode layer 500 has the first width W1 in the data line connection portion, and the low-potential electrode layer 500 is formed on an upper surface of the planarization layer 150. In the electroluminescent display device according to one aspect of the present disclosure, the low-potential electrode layer 500 extends in the first direction X of the display panel 100, whereby the low-potential electrode layer 500 may be formed in the data line connection portion as well as the low-potential contact portion CP.

In case of the related art, the low-potential electrode layer 500 has the second width W2 in the data line connection portion, whereby a short defect may occur between the data electrode layer DE and the low-potential electrode layer 500 in the area having a third width W3 in which the planarization layer 150 is not formed. In case of the electroluminescent display device according to one aspect of the present disclosure, the low-potential electrode layer 500 has the first width W1 in the data line connection portion. According as the low-potential electrode layer 500 and the data electrode layer DE confront each other under the circumstances that the planarization layer 150 is provided in-between, it is possible to prevent the short defect between the low-potential electrode layer 500 and the data electrode layer DE by the planarization layer 150 having the large thickness. Also, the low-potential electrode layer 500 is not formed in the area having the third width W3 in which the planarization layer 150 is not formed so that it is possible to prevent the short defect between the low-potential electrode layer 500 and the data electrode layer DE in the area having the third width W3.

The dam structure 160 is formed in the edges of the substrate 110 and the encapsulation substrate 170, whereby the substrate 110 and the encapsulation substrate 170 are adhered to each other by the use of dam structure 160. The dam structure 160 includes an adhesive material. The dam structure 160 is formed to surround the edges of the substrate 110 and the encapsulation substrate 170, whereby the inside of the electroluminescent display device may be sealed by the use of dam structure 160.

The encapsulation substrate 170 is disposed in the front surface on which an image is displayed. Thus, the encapsulation substrate 170 is formed of a transparent material, and the encapsulation substrate 170 has a moisture-permeation preventing function. The encapsulation substrate 170 may prevent external moisture from being permeated into the inside of the electroluminescent display device. The encapsulation substrate 170 may be adhered to the substrate 110 by the use of dam structure 160.

In case of the electroluminescent display device according to one aspect of the present disclosure, the third width W3 is formed between the left-side end of the planarization layer 150 and the left-side end of the dam structure 160. According as the left-side end of the planarization layer 150 is provided at a predetermined interval from the left-side end of the dam structure 160, it is possible to prevent external oxygen and moisture permeating through the dam structure 160 from being permeated into the inside of the plurality of pixels through the planarization layer 150.

In the electroluminescent display device according to one aspect of the present disclosure, the left-side end of the planarization layer 150 is provided at a predetermined interval from the left-side end of the dam structure 160, external oxygen and moisture from being permeated into the inside of the electroluminescent display device can be prevented. Further, reliability of the electroluminescent display device can be warranted. Also, according as the low-potential electrode layer 500 is formed on the planarization layer 150, the low-potential electrode layer 500 is not formed in the area having the third width W3 in which the planarization layer 150 is not formed, so that a short-circuit between the low-potential electrode layer 500 and the data electrode layer DE can be prevented.

According to the aspect of the present disclosure, the heat generation by lowering the current density in the low-potential contact portion can be reduced. In addition, a short circuit between the low-potential electrode layer and the data electrode layer can be prevented.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:
1. An electroluminescent display device comprising:
a display panel including a plurality of pixels;
a pad portion disposed at an edge of the display panel and including a low-potential power pad receiving a low potential power; and a low-potential contact portion electrically connecting the low potential power pad with the plurality of pixels and having a round corner shape,
wherein the low-potential power pad includes a low-potential power supply line transmitting the low-potential power to the low-potential contact portion, and
wherein the round corner shape is located at a contact area between the low-potential power supply line and the low-potential contact portion.

2. The electroluminescent display device according to claim 1, wherein the round corner shape of the low-potential contact portion is located at both end portions of lateral surfaces of an area adjacent to the low-potential power pad.

3. The electroluminescent display device according to claim 1, wherein the low-potential contact portion has an inverted triangle shape with rounded vertices.

4. The electroluminescent display device according to claim 3, wherein the inverted triangle shape with the rounded vertices of the low-potential contact portion is located at an area adjacent to the low-potential power pad.

5. The electroluminescent display device according to claim 1, wherein the low-potential contact portion further includes:
a link electrode layer connected with the low-potential power supply line and receiving the low-potential power;
a dummy electrode layer provided on the link electrode layer; and
a low-potential electrode layer provided on the dummy electrode layer.

6. The electroluminescent display device according to claim 5, wherein the link electrode layer is provided in the same layer as a gate electrode of the plurality of pixels,
wherein the dummy electrode layer is provided in the same layer as source/drain electrodes of the plurality of pixels, and
wherein the low-potential electrode layer is provided in the same layer as an anode electrode of the plurality of pixels.

7. The electroluminescent display device according to claim 6, wherein the low-potential electrode layer is connected with a cathode electrode of the plurality of pixels through a low-potential power line.

8. The electroluminescent display device according to claim 7, wherein the low-potential power line is provided in the same layer as the source/drain electrodes.

9. The electroluminescent display device according to claim 5, wherein the low-potential electrode layer extends to a first direction of the display panel, and the low-potential electrode layer has a width along with a second direction which is perpendicular to the first direction, and
wherein the width of the low-potential electrode layer at the low-potential contact portion is different from the width of the low-potential electrode layer at an area adjacent to the low-potential contact portion.

10. The electroluminescent display device according to claim 9, wherein the width at the low-potential contact portion is greater than the width at the area adjacent to the low-potential contact portion.

11. An electroluminescent display device comprising:
a display panel including a plurality of data lines and a plurality of gate lines;
a pad portion disposed at an edge of the display panel and including a low potential power pad receiving a low potential power and a data pad connected with the plurality of data lines; and
a low potential contact portion electrically connected with the low potential power pad and having a round corner shape located at both end portions of lateral surfaces of an area adjacent to the low-potential power pad,
wherein the low-potential power pad includes a low-potential power supply line transmitting the low-potential power to the low-potential contact portion, and
wherein the round corner shape is located at a contact area between the low-potential power supply line and the low-potential contact portion.

12. The electroluminescent display device according to claim 11, wherein the round corner shape of the low potential contact portion is located at an area adjacent to the low-potential power pad.

13. The electroluminescent display device according to claim 11, wherein the low-potential contact portion further includes:
a link electrode layer connected with the low-potential power supply line and receiving the low-potential power;
a dummy electrode layer provided on the link electrode layer; and
a low-potential electrode layer provided on the dummy electrode layer.

14. An electroluminescent display device comprising:
a display panel where an active area and an non-active area are defined at a substrate and including a plurality of data lines, a plurality of gate lines and a plurality of pixels;
a low potential power pad receiving a low-potential power through a low-potential power supply line;
a data pad connected with the plurality of data lines;
a link electrode layer electrically connected with the low-potential power supply line to receive the low-potential power;
a dummy electrode layer disposed on the link electrode layer;
a low-potential electrode layer disposed on the dummy electrode layer; and
a low potential contact portion electrically connected with the low potential power pad and having a round corner shape located at both end portions of lateral surfaces of an area adjacent to the low-potential power pad,
wherein the low-potential electrode layer extends to a first direction of the display panel, and the low-potential electrode layer has a width along with a second direction which is perpendicular to the first direction, and
wherein the width of the low-potential electrode layer at the low-potential contact portion is different from the width of the low-potential electrode layer at an area adjacent to the low-potential contact portion.

15. The electroluminescent display device according to claim 14, wherein the link electrode layer is provided in the same layer as a gate electrode of the plurality of pixels,
wherein the dummy electrode layer is disposed in the same layer as source/drain electrodes of the plurality of pixels, and
wherein the low-potential electrode layer is disposed in the same layer as an anode electrode of the plurality of pixels.

16. The electroluminescent display device according to claim 15, wherein the low-potential electrode layer is connected with a cathode electrode of the plurality of pixels through a low-potential power line.

17. The electroluminescent display device according to claim 16, wherein the low-potential power line is provided in the same layer as the source/drain electrodes.

\* \* \* \* \*